(12) United States Patent
Sakamoto et al.

(10) Patent No.: US 7,109,764 B2
(45) Date of Patent: Sep. 19, 2006

(54) PLL CLOCK SIGNAL GENERATION CIRCUIT

(75) Inventors: Yasuhiko Sakamoto, Nara (JP); Yoshihiro Nakao, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/983,649

(22) Filed: Nov. 9, 2004

(65) Prior Publication Data

US 2005/0099235 A1    May 12, 2005

(30) Foreign Application Priority Data

Nov. 10, 2003    (JP) ............... 2003-380153

(51) Int. Cl.
    *H03L 7/06* (2006.01)
(52) U.S. Cl. .................. 327/156; 327/159; 331/DIG. 2
(58) Field of Classification Search ...................... None
    See application file for complete search history.

(56) References Cited

U.S. PATENT DOCUMENTS

| | | | | |
|---|---|---|---|---|
| 4,516,083 A | * | 5/1985 | Turney | 331/1 A |
| 4,529,892 A | * | 7/1985 | Reilly et al. | 327/75 |
| 5,140,284 A | * | 8/1992 | Petersson et al. | 331/25 |
| 5,334,952 A | * | 8/1994 | Maddy et al. | 331/1 A |
| 5,371,480 A | * | 12/1994 | Hedberg et al. | 331/16 |
| 5,923,196 A | | 7/1999 | Okamoto | 327/156 |
| 5,999,024 A | * | 12/1999 | Kang | 327/156 |
| 6,049,254 A | * | 4/2000 | Knapp et al. | 331/16 |
| 6,275,074 B1 | * | 8/2001 | Hastings | 327/74 |
| 2003/0007222 A1 | | 1/2003 | Kwasaki et al. | 359/189 |

FOREIGN PATENT DOCUMENTS

| | | |
|---|---|---|
| EP | 1033815 A | 9/2000 |
| JP | 6-326603 A | 11/1994 |

* cited by examiner

*Primary Examiner*—Timothy P. Callahan
*Assistant Examiner*—An T. Luu
(74) *Attorney, Agent, or Firm*—Birch, Stewart, Kolasch and Birch, LLP

(57) ABSTRACT

A PLL clock signal generation circuit comprising a phase comparator, a charge pump circuit, a filter circuit, a voltage control oscillator and a divider, wherein a multiple rate control circuit is further included which detects a state of the reference voltage (output from a filter circuit) and controls a change of a multiple rate of a divider according to a state of the detected reference voltage. The multiple rate control circuit further outputs control signal LPFOUT for changing a multiple rate so that the PLL clock signal generation circuit does not deviate from a region capable of locking when being detected of deviation from the region capable of locking by detecting the state of reference voltage.

4 Claims, 10 Drawing Sheets fr: Standard Frequency
fs: Oscillation Frequency from VCO13
fo: Output Frequency
fv: Divided Frequency of N Division Counter

PLL CLOCK SIGNAL GENERATION CIRCUIT

CROSS REFERENCE TO RELATED APPLICATIONS

This Nonprovisional application claims priority under 35 U.S.C. §119(a) on patent application Ser. No. JP2003-380153 filed in Japan on 10 Nov. 2003, the entire contents of which are hereby incorporated by reference.

BACKGROUND OF THE INVENTION

1. Field of the Invention

The present invention relates to a PLL (Phase-Locked Loop) clock signal generation circuit, and it particularly relates to technology for increasing stable operation region (lock range).

2. Description of the Related Art

In the increasing demands for an IC card in the recent years, there has been a strong request for stable operations of an integrated PLL clock signal generation circuit even in a wide variation range of a standard clock input from outside the circuit, thus involving an increase of lock range of the PLL clock signal generation circuit.

FIG. 5 shows configuration of a basic PLL clock signal generation circuit. The PLL clock signal generation circuit includes a phase comparator 101, a charge pump circuit 102, a filter circuit 103, a voltage control oscillator 104, a first frequency divider 501 and a second frequency divider 502. An outline for the operation of each of the circuit will be described bellow.

The phase comparator 101 is fed with a standard clock from outside, and a comparative clock of which output frequency of the voltage control oscillator 104 is divided by the second frequency divider 502. The phases of the two clocks are compared at the phase comparator 101. When the phase of the comparative clock delays compared with the phase of the standard clock, the circuit outputs the UP signal by amount equal to the delay. On the other hand, when the phase of the comparative clock proceeds to a phase of the standard clock, the circuit outputs the DOWN signal by amount equal to the proceedings. These UP signal and DOWN signal are integrated through the charge pump circuit 102 and the filter circuit 103. The voltage integrated by the UP signal rises, and the voltage integrated by the DOWN signal falls. Integrated voltage becomes reference voltage for changing the oscillation frequency of the voltage control oscillator 104.

The voltage control oscillator 104 includes a ring oscillator circuit that uses an inverter of odd numbered stage such as three stages, five stages, etc. In this configuration, the oscillation frequency can be changed by changing the input voltage. More specifically, the increase in the input voltage of the voltage control oscillator 104 causes increase in the output oscillation frequency of the voltage control oscillator 104, and the decrease in the input voltage of the voltage control oscillator 104 causes the decrease in the output oscillation frequency of the voltage control oscillator 104. The output clock of the voltage control oscillator 104 is divided at the second frequency divider 502 to be comparative clock and is input to the phase comparator 101 together with standard clock. Therefore, the output of the voltage control oscillator 104 is the oscillation frequency of the predetermined multiple rate (1/(ratio of division)) of the standard clock when the PLL clock signal generation circuit is locked to ensure stable operation. When the output clock of the voltage control oscillator 104 is used as system clock of a semi conductor device, the output clock is used as internal clock after separately divided by the first frequency divider 501.

FIG. 6 shows a relationship between input (reference) voltage of the voltage control oscillator 104 and oscillation frequency which is the output signal of the voltage control oscillator 104. It is divided into three states, those are, the first state, the second state and the third state according to the voltage range of the reference voltage. In the first state, the oscillation frequency marks a point below a lower limit of the operation of the voltage control oscillator 104, and does not change (under saturation condition) as the reference voltage changes. In the second state, the oscillation frequency changes as the reference voltage. In the third state, the oscillation frequency marks a point above an upper limit of the operation of the voltage control oscillator 104, and does not change (under saturation condition) as the reference voltage changes. In the second state, with respect to changes of the standard clock, the comparative clock can be matched to ensure a stable operation (lock) of the PLL clock signal generation circuit, which is referred to as a region capable of locking (or a lock range).

As shown in FIG. 6, VCL shows the reference voltage that outputs the oscillation frequency of the lower limit operation of the voltage control oscillator 104, while VCH shows the reference voltage that outputs the oscillation frequency of the upper limit operation of the voltage control oscillator 104.

In the increasing demand for an IC card in the recent years, there has been a strong request to handle the input of standard clock frequency with a wide frequency range, thus increase of the lock range of PLL clock signal generation circuit is necessary. As a prior art for increasing the lock range, Japanese Unexamined Patent Publication No. 6-326603, for example, is disclosed.

A prior art for increasing a lock range disclosed in the Japanese Unexamined Patent Publication No. 6-326603 will be described below with reference of FIG. 10.

As shown in FIG. 10, the PLL clock signal generation circuit of the prior art includes a phase comparator 11 that generates error voltage due to the phase difference, a low-pass filter 12, a voltage control oscillator 13 and a programmable N counter 14. This circuit uses one voltage control oscillator 13 and provides a frequency changer 15 (a 2n programmable divider is used in the following embodiment) between the one voltage control oscillator 13 and the programmable N counter 14. In the case where a 2n programmable divider n=0, the operation of the circuit configuration is such that the oscillation frequency fs of the voltage control oscillator 13 is N divided by the programmable N counter 14 to generate a frequency fv (wherein fv=fs/N) and is input to the phase comparator 11 together with the input signal of the standard clock fr. The phase comparator 11 generates error voltage according to the phase difference between the standard frequency fr and the divided frequency fv of the N division counter. The output error voltage from the phase comparator 11 becomes the control voltage of the voltage control oscillator 13 by cutting off the high frequency components at the low pass filter 12. The control voltage is provided to narrow the difference between the divided frequency fv of the oscillation frequency fs of the voltage control oscillator 13 and the standard clock fr. When the difference between the frequency fv and the standard clock fr is zero (0), the circuit is under a locked condition, and the relation between the frequency fv and the standard clock fr can be expressed by the following equation (1). When the 2n programmable divider n=0, and the output frequency f0 expressed in the equation (3) is used, the relationship can be expressed by the equation (2).

$$fr=fv=fs/N \quad (1)$$

$$fr=fv=f0/N \quad (2)$$

$$f0=N \times fr \quad (3)$$

When the region where oscillation is available in the output frequency f0 is expressed with a minimum oscillation frequency fmin and a maximum oscillation frequency fmax, the region can be expressed in the equation (4) through (6) according to the value n of the 2N programmable divider which is a frequency changer 15.

$$f0=\text{fmin through fmax: } n=0 \quad (4)$$

$$f0=f\text{min}/2 \text{ through } f\text{max}/2: n=1 \quad (5)$$

$$f0=f\text{min}/4 \text{ through } f\text{max}/4: n=2 \quad (6)$$

From the above, the output of the frequency changer 15 is changeable by a value of n so that a wider range of output frequency can be obtained.

However, the PLL clock signal generation circuit in the prior art disclosed in the Japanese Unexamined Patent Publication No. 6-326603 requires the n value of the frequency changer 15 (2N programmable divider) to be set to stretch the lock range. The n value should be set from the CPU which controls the PLL clock signal generation circuit and is mounted outside the PLL clock signal generation circuit. In order to handle the change of the standard clock, the clock should be observed by the CPU and the n value should be changed according to the change of the standard clock. This increases the load to the CPU.

The CPU process in the IC card ranges widely such as the data communication. Thus it is important to reduce the load to the CPU as much as possible. The circuit which observes the changes occurring at the standard clock needs to be configured.

SUMMARY OF THE INVENTION

In view of the above-mentioned problems, the objective of the present invention is to provide a PLL clock signal generation circuit that can maintain a proper locked status even when the operation region of the voltage control oscillation is narrow.

In order to achieve the above mentioned objective, the PLL clock signal generation circuit according to the first characteristics of the present invention includes a phase comparator, a charge pump circuit, filter circuit, a voltage control oscillator, and a divider, the PLL clock signal generation circuit further including a multiple rate control circuit which outputs a control signal that changes the multiple rate so that the PLL clock signal generation circuit does not deviate from a region capable of locking when being detected of deviation from the region capable of locking by detecting a reference voltage which is an output of a filter circuit.

Therefore, according to the first characteristics of the PLL clock signal generation circuit mentioned above, the reference to the reference voltage which is an output of the filter circuit enables the detection of a state of locking of the PLL clock signal generation circuit, and also enables the change of multiple rate of the divider prior to the transition of the reference voltage to a state corresponding to a saturation of the voltage control oscillator, thereby adjusting a reference voltage to be capable of maintaining a state of locking of the PLL clock signal generation circuit. In this way, a PLL clock signal generation circuit is achieved that can maintain a proper state of locking even in the case when the operation region of the voltage control oscillator is narrow.

Additionally in the second characteristics, the PLL clock signal generation circuit according to the first characteristics of the present invention preferably includes a first Schmitt trigger circuit capable of detecting the multiple rate control circuit having the reference voltage higher than the upper limit value of the voltage range capable of locking, a second Schmitt trigger circuit capable of detecting the reference voltage lower than the lower limit value of the voltage range capable of locking, a D flip-flop determining that the reference voltage being higher than the upper limit value and outputting the control signal for increasing a ratio of division of the divider when the both the first Schmitt trigger circuit and the second Schmitt trigger circuit show the high level output state, and a control circuit determining that the reference voltage being lower than the lower limit value and resetting the D flip-flop when the both the first Schmitt trigger circuit and the second Schmitt trigger circuit show the low level output state. Such configuration of the multiple rate control circuit allows a proper and a stable detection of a state of the reference voltage and delivers a stable performance of the action and an effect of the first characteristics mentioned above.

Furthermore in the third characteristics, the PLL clock signal generation circuit according to the second characteristics of the present invention preferably has each of the hysteresis width of the first Schmitt trigger circuit and the second Schmitt trigger circuit set to a value above a ripple voltage overlapping the output voltage of the charge pump circuit. Such configuration of the Schmitt trigger circuit allows a safer design not susceptible to the ripple voltage of the charge pump circuit.

DETAILED DESCRIPTION OF THE INVENTION

Figure 1:
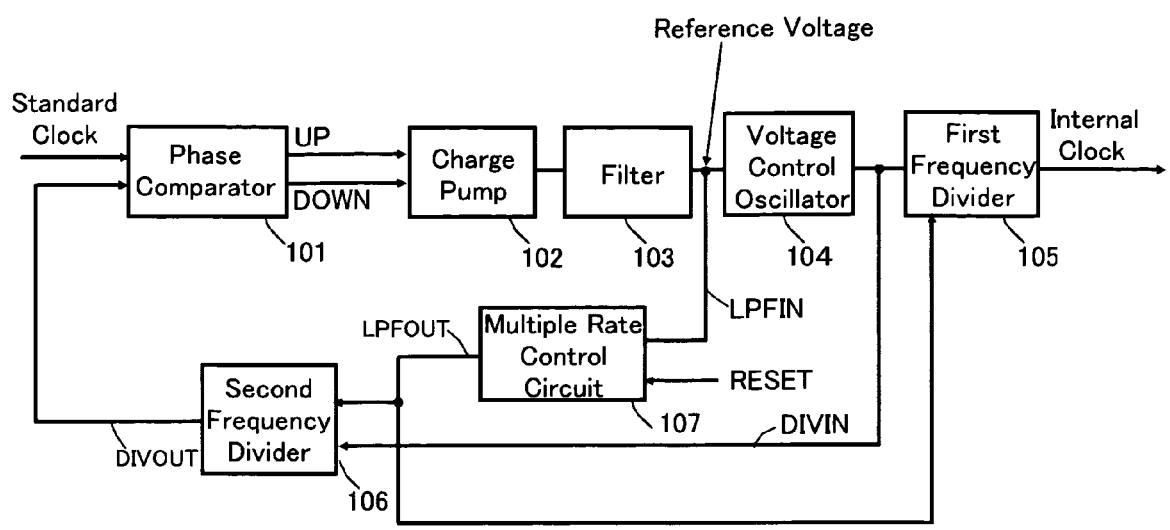
FIG. 1 is a circuit block diagram showing a circuit configuration of an embodiment of the PLL clock signal generation circuit according to the present invention.

An embodiment of the PLL clock signal generation circuit according to the present invention (hereinafter, referred to as "the present circuit") will be described with reference to the drawings. The same reference numerals are used to refer the same circuit components of the conventional PLL clock signal generation circuit throughout the various views.

Figure 5:
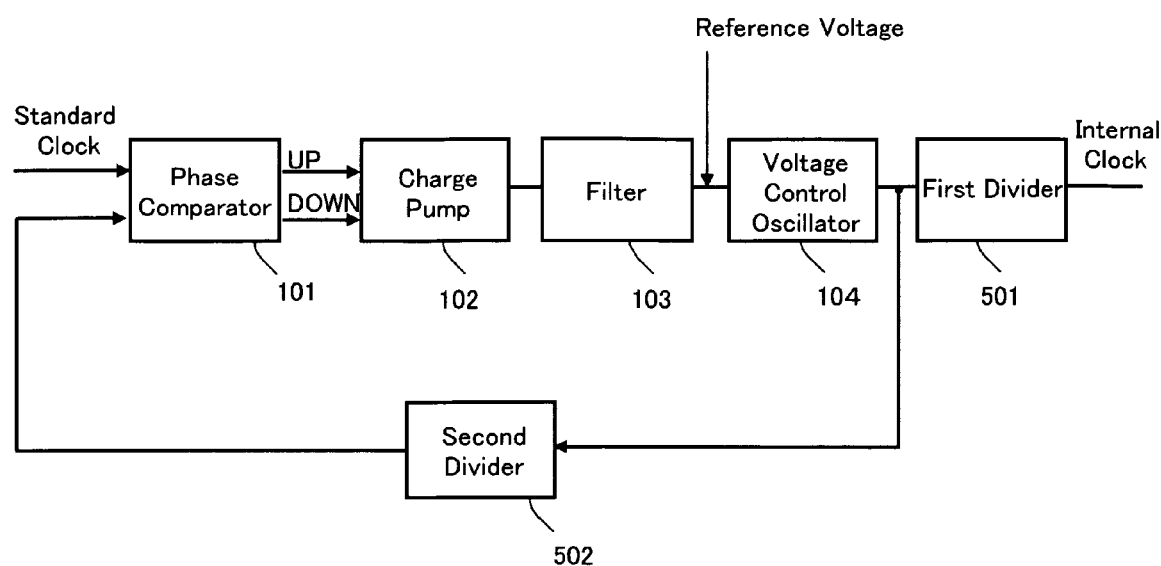
FIG. 5 is a circuit block diagram showing an example of circuit configuration of a conventional PLL clock signal generation circuit.

As shown in FIG. 1, the present circuit includes a multiple rate control circuit 107 in addition to a phase comparator 101, a charge pump circuit 102, a filter circuit 103, a voltage control oscillator 104, a first frequency divider 105 and a second frequency divider 106. All circuits, but a multiple rate control circuit 107, are the same with the corresponding circuits of the conventional PLL clock signal generation circuit shown in FIG. 5. The multiple rate control circuit 107 is input by a reference voltage (name of the signal: LPFIN) which is an output of the filter circuit 103, and the output (name of the signal: LPFOUT) is input to the second divider 106.

Figure 2:
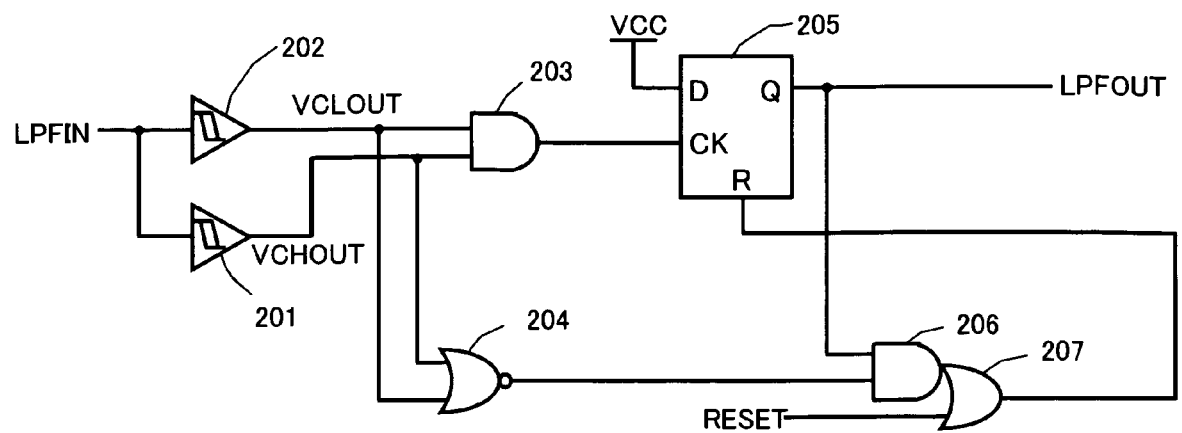
FIG. 2 is a logic circuit diagram showing a configuration example of a multiple rate control circuit of the PLL clock signal generation circuit according to the present invention.

FIG. 2 shows a configuration example of a multiple rate control circuit 107. As shown in FIG. 2, the multiple rate control circuit 107 includes the first Schmitt trigger circuit 201 for detecting the upper limit value of the reference voltage, the second Schmitt trigger circuit 202 for detecting the lower limit value of the reference voltage, an AND gate 203 for detecting states, a NOR gate 204 for detecting states, a D flip flop 205, and an AND gate 206 for switching a divider. The NOR gate 204 and the AND gate 206 allow a control circuit to reset a D flip flop 205 by determining the reference voltage being lower than the lower limit value when the state of output of both the first Schmitt trigger circuit 201 and the second Schmitt trigger circuit 202 show "L" (Low) level. The RESET signal which is the input signal of OR gate shown at 207 in FIG. 2 is provided for setting a state of a D flip flop 205 which for switching a divider when a system reset occurred because of the application of power.

The output from the filter circuit 103 (name of the signal: LPFIN) is input to the multiple rate control circuit 107, and the level of the reference voltage is detected at the first Schmitt trigger circuit 201 for detecting an upper limit value of the reference voltage and the second Schmitt trigger circuit 202 for detecting the lower limit value of the reference voltage. When VCLOUT signal and VCHOUT signal are at the "H" level, a transition from the second condition to the third condition is detected, and LPFOUT signal, the output from the D flip flop 205 which is for switching the divider, is switched to the "H" (High) level. On the other hand, when VCLOUT signal and VCHOUT signal are at the "L" level, a transition from the second condition to the first condition is detected, and LPFOUT signal, the output from the D flip flop 205 which is for switching the divider, is switched to the "L" level.

Figure 6:
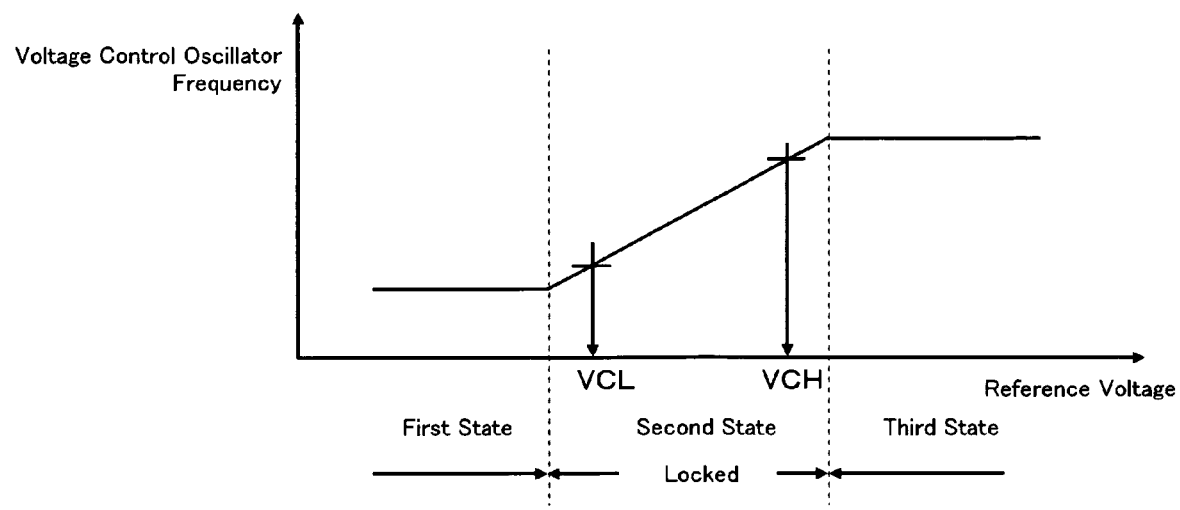
FIG. 6 is a diagram illustrating a relationship between a reference voltage and an oscillation frequency of the voltage control oscillator in a conventional PLL clock signal generation circuit.

It is necessary for the multiple rate control circuit 107 to detect the switching of the reference voltage from the second state to the third state. In this embodiment as shown in FIG. 2, the multiple rate control circuit 107 uses the first Schmitt trigger circuit 201 that is adjusted to reverse the output by the voltage value VCH described in FIG. 6, thereby detecting the transition of the reference voltage from the second state to the third state. It is also necessary for the multiple rate control circuit 107 to detect the switching of the reference voltage from the second state to the first state. In this embodiment as shown in FIG. 2, the multiple rate control circuit 107 uses the second Schmitt trigger circuit 202 that is adjusted to reverse the output by the voltage value VCL described in FIG. 6.*thereby* detecting the transition of the reference voltage from the second state to the first state.

The following shows a reason for the use of the Schmitt trigger circuit. The output voltage of the charge pump circuit 102 is overlapped with the ripple voltage. The Schmitt trigger circuit which has the hysteresis is suited to remove the ripple voltage. The value of ripple voltage is determined mostly by circuit configuration of the charge pump circuit 102. The width of the hysteresis needs to be set at a value above that of ripple voltage.

Figure 7:
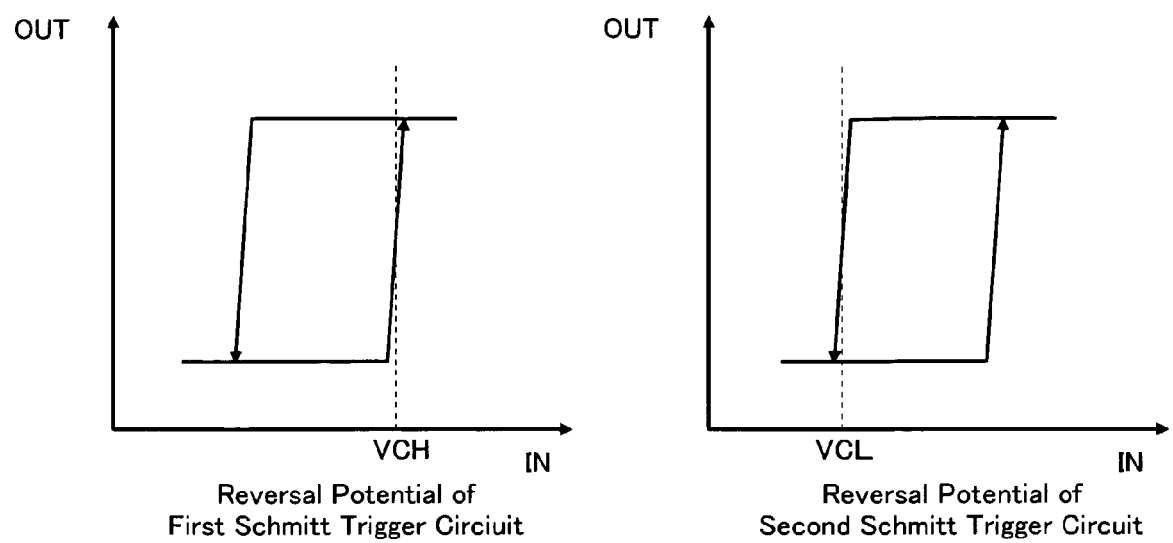
FIG. 7 is a diagram of input/output characteristics illustrating a state of setting a reverse voltage of the first Schmitt trigger circuit and the second Schmitt trigger circuit in the multiple rate control circuit of the PLL clock signal generation circuit according to the present invention.

FIG. 7 shows the hysteresis voltage setting of the first Schmitt trigger circuit 201 and the second Schmitt trigger circuit 202. In the first Schmitt trigger circuit 201, when the hysteresis input voltage detecting VCH is above the VCH, the trigger is set to output "H", and the input voltage has hysteresis when the output returns to "L". On the other hand, in the second Schmitt trigger circuit 202, when the hysteresis input voltage detecting VCL is below the VCL, the trigger is set to output "L", and the input voltage has hysteresis when the output returns to "H".

Figure 3:
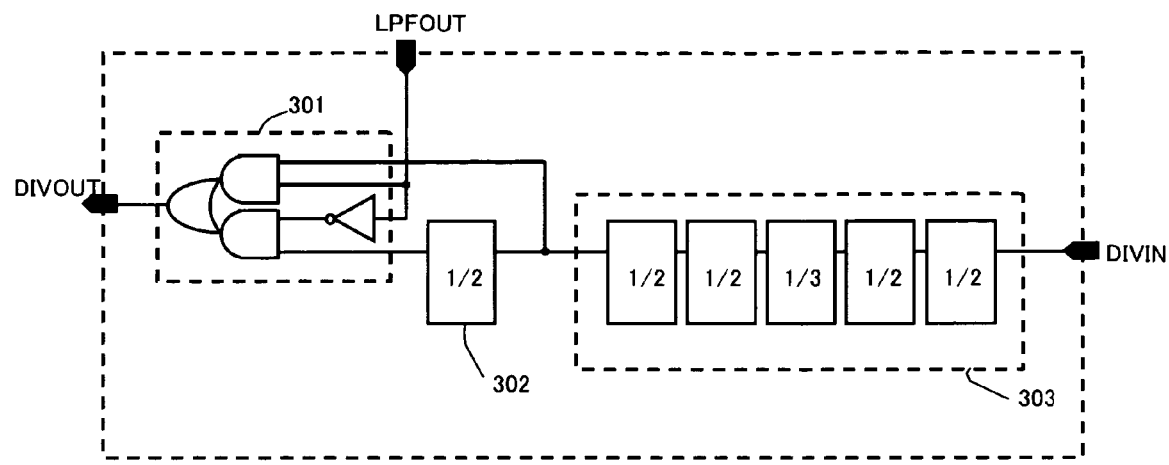
FIG. 3 is a circuit block diagram showing a configuration example of the second divider of the PLL clock signal generation circuit according to the present invention.

FIG. 3 shows an example of a circuit configuration of the second divider 106. The second divider 106 includes a selector 301, a 1/2 divider 302, and a 1/48 divider 303. In this embodiment, the division of the second divider 106 is configured by 5 stages of the 1/2 divider and one stage of the 1/3 divider enabling the division of the 1/96. The output clock (name of the signal: DIVIN) of the voltage control oscillator 104 is input to the second divider 106 where the output clock is divided. Additionally, the output of the multiple rate control circuit 107 (name of the signal: LPFOUT) is input to the second divider 106 and is connected to the selector 301 which decides to connect the 1/2 divider 302 at the last stage to the 1/48 divider 303. The output of the selector 301 (name of the signal: DIVOUT) is output from the second divider 106 to be input as comparative clock together with standard clock to the phase comparator 101.

Figure 4:
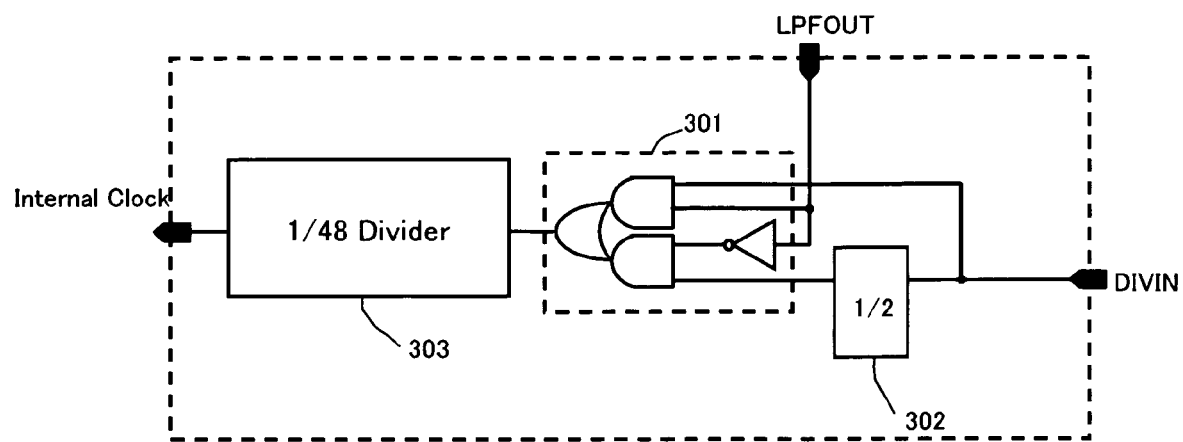
FIG. 4 is a circuit block diagram showing a configuration example of the first divider of the PLL clock signal generation circuit according to the present invention.

FIG. 4 shows an example of a circuit configuration of the first divider 105. The first divider 105 includes a selector 301, a 1/2 divider 302 and a 1/48 divider 303. In this embodiment, the division of the first divider 105 is configured by 5 stages of the 1/2 divider and one stage of the 1/3 divider enabling the division of the 1/96. The output clock (name of the signal: DIVIN) of the voltage control oscillator 104 is input to the first divider 105 where the output clock is divided. Additionally, the output of the multiple rate control circuit 107 (name of the signal: LPFOUT) is input to the first divider 105 and is connected to the selector 301 which decides to connect the 1/2 divider 302 at the first stage to the 1/48 divider 303. The output of the 1/48 divider 303 is provided as internal clock.

The circuit operation of the present circuit according to the present invention will be described as follows.

When standard clock has phase which proceeds to that of comparative clock, the phase comparator 101 corrects the differences by increasing reference voltage to raise the oscillation frequency of the voltage control oscillator 104. The circuit operation including the multiple rate control circuit 107 during this process according to the present invention will be described as follows.

The standard clock and the comparative clock which is the output frequency of the voltage control oscillator 104 divided at the second divider 106 are input to the phase comparator 101. The phase comparator compares the phases of the two clocks. When the phase of the comparative clock delays compared with the phase of the standard clock, the phase comparator produces UP signal by the amount equal to the phase delayed. On the contrary, when the phase of the comparative clock leads compared with the phase of the standard clock, the phase comparator produces DOWN signal by the amount equal to the phase of the leading. These UP signal and DOWN signal are converted to voltage through the charge pump circuit 102 and the filter circuit 103. The output voltage of the charge pump circuit 102 is increased by UP signal, and the output voltage of the charge pump circuit 102 is decreased by DOWN signal. This output voltage becomes reference voltage for changing the oscillation frequency of the voltage control oscillator 104. The reference voltage increases in the operation example of the present invention.

The reference voltage, as LPFIN signal, is input to the first Schmitt trigger circuit 201 for detecting an upper limit value of the reference voltage and the second Schmitt trigger circuit 202 for detecting a lower limit value of the reference voltage at the multiple rate control circuit 107. When the reference voltage is further increased from the second state to the third state in order to correct the led phase of the standard clock, both VCHOUT that is output of the first Schmitt trigger circuit 201 for detecting the upper limit value of the reference voltage and the VCLOUT that is output of the second Schmitt trigger circuit 202 for detecting the lower limit value of the reference voltage reach the "H" level to set the LPFOUT signal that is the output of the D flip flop 205 for switching the divider to the "H" level.

The LPFOUT signal output from the multiple rate control circuit 107 is input to the selector 301 of the second divider 106 to switch the 1/2 divider 302 that is the last stage of the second divider 106 from a state of connection to a state of bypass. When the LPFOUT signal is in a state of the "H" level, the ratio of division of the second divider 106 is switched from 1/96 to 1/48. At this time, the frequency of the DIVOUT signal (comparative clock) that is output of the second divider is increased and when it reaches above the frequency of the standard clock, the output of the phase comparator 101 is changed to DOWN signal to UP signal. The reference voltage then decreases to lower the frequency of the voltage control oscillator 104. When the frequency of the voltage control oscillator 104 is lowered and is in the second state from the third state, the VCHOUT signal that is output signal of the first Schmitt trigger circuit 201 reaches the "L" level (the VCLOUT signal that is the output signal of the first Schmitt trigger circuit 202 remains at the "H" level), but the output of the NOR gate 204 for detecting states does not change and LPFOUT signal stays in "H" level, and the ratio or division of the second divider 106 does not change. Therefore, the oscillation frequency of the voltage control oscillator 104 is further decreased. The present circuit then obtains a stable operation (a state of locking) when a phase of the frequency of the voltage control oscillator 104×a phase of 1/48 is equal to a phase of the standard clock. This enables the circuit to correspond to a standard clock having higher frequency.

Figure 8:
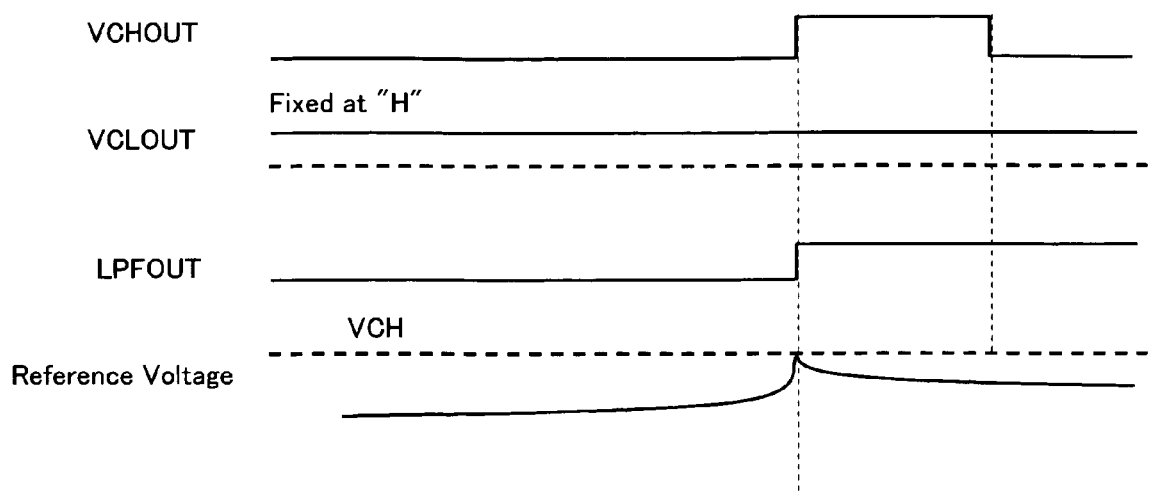
FIG. 8 is a diagram of signal wave form illustrating an operation example of PLL clock signal generation circuit according to the present invention.

FIG. 8 shows voltage wave forms of each signal in the above operation example (correction of the led phase). When the reference voltage is increased and reaches at VCH voltage (an upper limit value of the voltage range that is capable of locking), the VCHOUT signal is changed to the "H" level. Similarly, with the VCLOUT signal at the "H" level, the output of the AND gate 203 for detecting states is switched to the "H" level and the LPFOUT signal that is output from the D flip flop 205 for switching the divider becomes "H" level. The LPFOUT signal switches the second divider 106 to lower the reference voltage. When the phase of the standard clock and the phase of the comparative clock are at the same phase, the operation is stabilized (a state of locking) and the value of the reference voltage remains same.

During stable operations, the frequency of the voltage control oscillator 104 is dropped to show a value of a 1/2 of the predetermined internal clock. The internal clock should therefore be corrected by the first divider when in use. FIG. 4 shows an internal circuit of the first divider. The divider has a selector 301 as a corrector and corrects the internal clock at a predetermined value by bypassing a 1/2 divider 302 when the LPFOUT signal is at the "H" level.

The following description shows a circuit operation of the present invention in which the phase of the standard clock is behind the phase of the comparative clock.

The phase comparator 101 detects the standard clock being behind the comparative clock, and outputs DOWN signal to the charge pump circuit 102. The output voltage of the charge pump circuit 102 falls and the reference voltage is lowered through the filter circuit 103 to further lower the oscillation frequency of the voltage control oscillator 104. When the reference voltage is changed from the second state to the first state, both output VCHOUT from the first Schmitt trigger circuit 201 for detecting the upper limit value of the reference voltage and the output VCLOUT from the second Schmitt trigger circuit 202 for detecting the lower limit value of the reference voltage are at the "L" level and to set the output from the NOR gate 204 for detecting states to the "H" level and also to set the output from the AND gate 206 for detecting states to the "H" level. The output of the D flip flop 205 for switching the divider is reset to set the LPFOUT signal to the "L" level. This switches the second divider from a state of bypass to a state of connection. When the LPFOUT signal is a state of the "L", the ratio of division of the second divider 106 is switched from 1/48 to 1/96. At this time the frequency of the DIVOUT signal that is the output of the second divider is lowered and is below the frequency of the standard clock, the output of the phase comparator 101 is switched from DOWN signal to UP to increase the frequency of the voltage control oscillator 104. In the case of transition from the first state to the second state, the VCLOUT signal reaches to the "H" level (the VCHOUT signal remains at the "L" level) but the output of the NOR gate 204 for detecting states does not change. The LPFOUT signal remains at the "L" level, and the ratio of division of the second divider 106 also remains unchanged. Therefore, the frequency of the voltage control oscillator 104 increases further. The PLL clock signal generation circuit thus obtains the stable operation when a phase of the frequency of the voltage control oscillator 104×a phase of 1/96 is equal to a phase of the standard clock.

Figure 9:
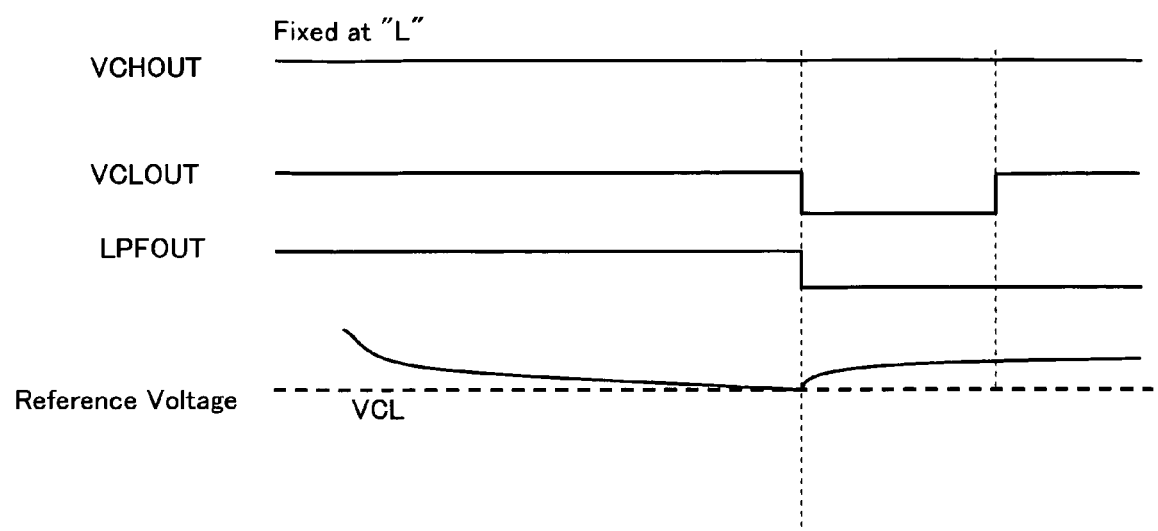
FIG. 9 is a diagram of signal wave form illustrating an operation example of PLL clock signal generation circuit according to the present invention.
Figure 10:
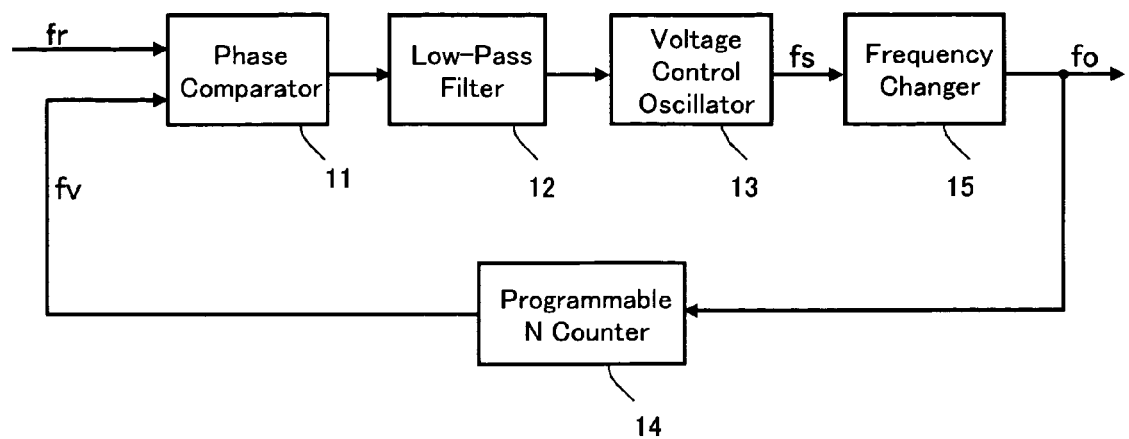
FIG. 10 is a circuit block diagram showing a circuit configuration of a conventional PLL clock signal generation circuit.

FIG. 9 shows voltage wave forms of each signal in the above operation example (correction of the delayed phase). When reference voltage falls and reaches below the VCL voltage (a lower limit value of the voltage range that is capable of locking), the VCLOUT signal becomes "L" level. VCHOUT signal that remains at the "L" level and the VCLOUT signal that falls to the "L" level bring LPFOUT signal to the "L" level. This switches the second divider 106 to further increase the reference voltage. After re-locking, the reference voltage becomes constant and shows the stable operation.

In the above embodiment, the multiple rate control circuit 107 is not limited by the circuit configuration illustrated in FIG. 2. The first divider 105 and the second divider 106 are also not limited by the circuit configuration illustrated in FIGS. 4 and 3 respectively. The circuits 105 through 107 may be replaced with the other circuit configurations which can achieve circuit operations described in the above embodiment.

As described in detail, the present circuit is the PLL clock signal generation circuit which includes the phase comparator, the charge pump circuit, the filter circuit, the voltage control oscillator, and the divider. The PLL clock signal generation circuit also includes a multiple rate control circuit which detects the state of a reference voltage which is the output from the filter circuit and changes the multiple rate according to the state of detection. The PLL clock signal generation circuit further detects the reference voltage in a state wherein the PLL clock signal generation circuit is out of a region capable of locking and changes the multiple rate to adjust a state to be capable of locking. In such circuit configuration, the reference to a reference voltage allows detection of a state of locking of the PLL clock signal generation circuit, and the multiple rate can be changed before reference voltage moves into the state of saturation of the voltage control oscillator. As a result, a PLL clock signal generation circuit that can maintain a proper state of locking even when an operation region of the voltage control oscillator being narrow can be provided.

Furthermore, the configuration of the multiple rate control circuit shown in FIG. 2 allows a relatively easy detection of a reference voltage and changes of the multiple rate. These features described above enables a configuration of the PLL clock signal generation circuit to have a wider lock range. Moreover, a hysteresis width of the first Schmitt trigger circuit and the second Schmitt trigger circuit may be set at a point above a ripple voltage value overlapping the output voltage of a charge pump circuit to design a safer configuration that is not susceptible to the ripple voltage.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A PLL clock signal generation circuit comprising a phase comparator, a charge pump circuit, a filter circuit, a voltage control oscillator, at least two dividers, and a multiple rate control circuit, wherein said multiple rate control circuit detects an upper and a lower limit value of a reference voltage and outputs a control signal to each of the at least two dividers for changing a multiple rate so that said PLL clock signal generation circuit does not deviate from a region capable of locking when being detected of deviation from the region capable of locking by detecting said upper and lower limits of said reference voltage which is an output from said filter circuit.

2. The PLL clock signal generation circuit according to claim 1, wherein the multiple rate control circuit comprising:

a first Schmitt trigger circuit capable of detecting said reference voltage being higher than an upper limit value of a voltage range capable of locking, a second Schmitt trigger circuit capable of detecting said reference voltage being lower than a lower limit value of a voltage range capable of locking, a D flip-flop producing said control signal for increasing a ratio of division of said divider by determining said reference voltage being higher than said higher limit value when the output state of both of said first Schmitt trigger circuit and said second Schmitt trigger circuit are at high level, and a control circuit resetting said D flip-flop by determining said reference voltage being lower than a lower limit value when the output state of both of said first Schmitt trigger circuit and said second Schmitt trigger circuit are at low level.

3. The PLL clock signal generation circuit according to claim 2, wherein each of hysteresis widths of said first Schmitt trigger circuit and said second Schmitt trigger circuit is set above the ripple voltage value overlapping the output voltage of said charge pump circuit.

4. The PLL clock signal generation circuit according to claim 1, wherein the multiple rate control circuit includes a Schmitt trigger circuit which has a hysteresis suited to remove a ripple voltage associated with an output of the charge pump circuit.

* * * * *